United States Patent [19]
Barrow

[11] Patent Number: 5,889,655
[45] Date of Patent: Mar. 30, 1999

[54] INTEGRATED CIRCUIT PACKAGE SUBSTRATE WITH STEPPED SOLDER MASK OPENINGS

[75] Inventor: Michael Barrow, El Dorado Hills, Calif.

[73] Assignee: Intel Corporation, Santa Clara, Calif.

[21] Appl. No.: 978,772

[22] Filed: Nov. 26, 1997

[51] Int. Cl.[6] ....................................................... H05K 1/14
[52] U.S. Cl. ........................... 361/760; 361/764; 361/772; 361/773; 361/774; 361/777; 361/779; 361/783; 257/738; 257/737; 257/778; 257/780; 228/180.22; 438/612; 438/613; 438/108
[58] Field of Search ..................................... 361/760, 764, 361/772, 773, 774, 777, 779, 783; 257/737, 738, 778, 780; 228/180.22; 438/612, 613, 108

[56] References Cited

U.S. PATENT DOCUMENTS

| | | | |
|---|---|---|---|
| 5,034,345 | 7/1991 | Shirahata | 438/614 |
| 5,376,584 | 12/1994 | Agarwala | 438/614 |
| 5,656,863 | 8/1997 | Yasunaga et al. | 257/778 |
| 5,660,321 | 8/1997 | Isida et al. | 228/248.1 |

*Primary Examiner*—Leo P. Picard
*Assistant Examiner*—David Foster
*Attorney, Agent, or Firm*—Blakely, Sokoloff, Taylor & Zafman LLP

[57] ABSTRACT

A substrate for an integrated circuit package. Located on a bottom surface of the substrate are a plurality of contact pads. Solder balls are attached to the contact pads and then reflowed to mount the package to a printed circuit board. The bottom surface of the substrate has a first layer of solder mask. The first layer has a plurality of first openings which expose at least a portion of each contact pad. Adjacent to the first layer of solder mask is a second layer of solder mask which has a plurality of second openings that also expose the contact pads. The diameter of each second opening is larger than the diameter of each first opening. The openings may be created by etching the layers of solder mask. The etching process typically creates in annular lips in the solder mask openings. The larger second openings reduce the stress risers of the solder balls created by the inner lips of the solder mask.

7 Claims, 2 Drawing Sheets

INTEGRATED CIRCUIT PACKAGE SUBSTRATE WITH STEPPED SOLDER MASK OPENINGS

BACKGROUND OF THE INVENTION

1. FIELD OF THE INVENTION

The present invention relates to an integrated circuit package.

2. BACKGROUND INFORMATION

Integrated circuits are typically assembled into packages that are soldered to printed circuit boards. There are many types of integrated circuit packages including ball grid array (BGA) packages.

FIG. 1 shows a BGA package of the prior art. The package includes a substrate 1 that supports an integrated circuit 2. The integrated circuit 2 is typically wire bonded to bond fingers (not shown) on the top surface of the substrate. The bottom surface of the substrate 1 has a plurality of contact pads 3 that are electrically connected to the integrated circuit 2 by the bond fingers and vias that extend through the substrate 1. Solder balls 4 are attached to the contact pads 3 and then subsequently reflowed to mount the package to a printed circuit board (not shown).

As shown in FIG. 2, layers of solder mask 5 are applied to the bottom surface of the substrate 1 and then etched in certain locations to expose the contact pads 3. The solder mask 5 prevents shorting between the solder balls 4 when the solder is reflowed onto a printed circuit board. It has been found that the etching processes creates an annular lip 6 in the solder mask 5. The lip 6 creates a stress riser in the solder joint which may induce a crack 7 in the solder. The crack 7 may lead to a failure in the solder joint and render the integrated circuit package inoperable. It would be desirable to provide a BGA integrated circuit package and a process for forming the package that reduces the stress risers in the solder joints.

SUMMARY OF THE INVENTION

The present invention includes a substrate for an integrated circuit package. The substrate has a contact pad. A first layer of solder mask is applied to the substrate. The first layer of solder mask has a first opening that exposes at least a portion of the contact pad. Adjacent to the first layer of solder mask is a second layer of solder mask. The second layer has a second opening that exposes at least a portion of the contact pad. The second opening has a diameter that is larger than the diameter of the first opening.

DETAILED DESCRIPTION OF THE INVENTION

One embodiment of the present invention is a substrate for an integrated circuit package. Located on a bottom surface of the substrate are a plurality of contact pads. Solder balls are attached to the contact pads and then reflowed to mount the package to a printed circuit board. The bottom surface of the substrate has a first layer of solder mask. The first layer has a plurality of first openings which expose at least a portion of each contact pad. Adjacent to the first layer of solder mask is a second layer of solder mask which has a plurality of second openings that also expose the contact pads. The diameter of each second opening is larger than the diameter of each first opening. The openings may be created by etching the layers of solder mask. The etching process typically creates annular lips in the solder mask openings. The larger second openings reduce the stress risers of the solder balls created by the inner lips of the solder mask.

Figure 1:
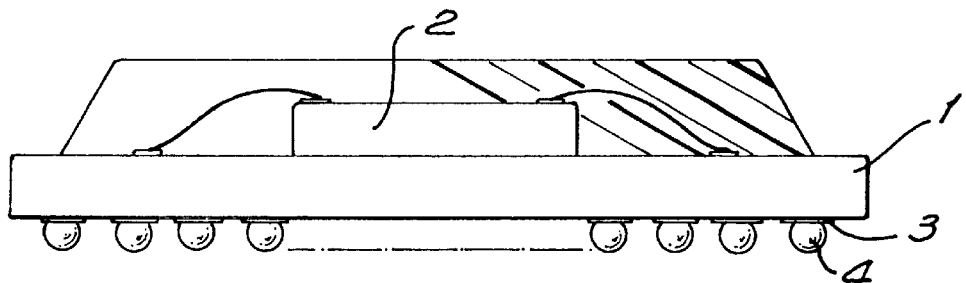
FIG. 1 is a cross-sectional view of an integrated circuit package of the prior art.
Figure 2:
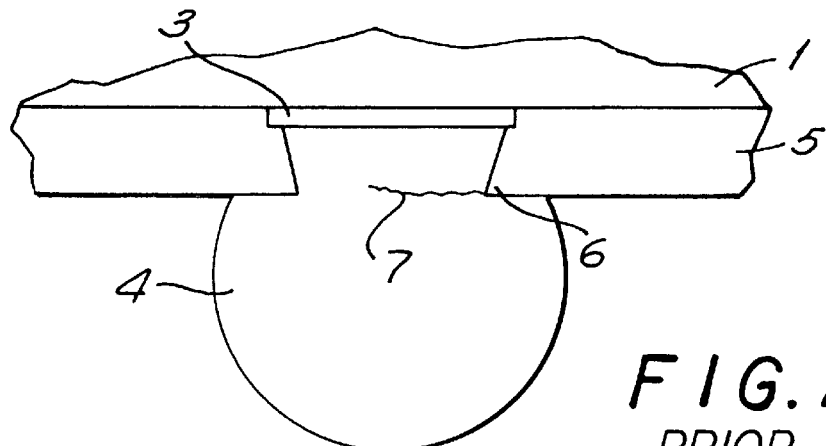
FIG. 2 is an enlarged sectional view of the integrated circuit package shown in FIG. 1.
Figure 3:
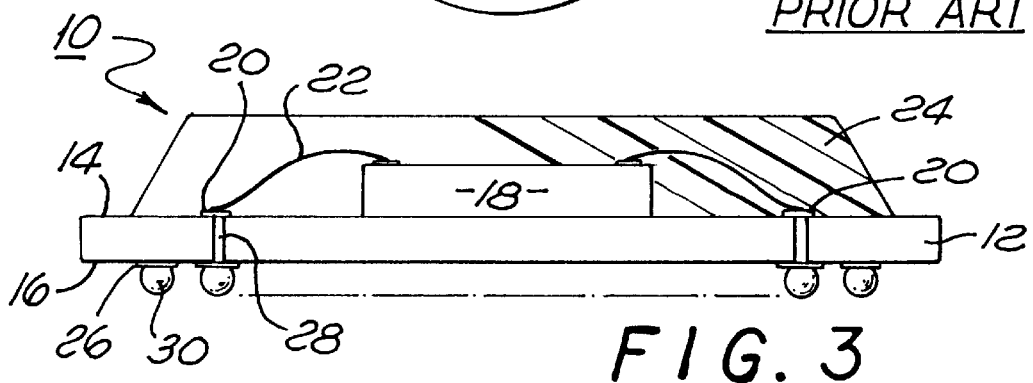
FIG. 3 is a cross-sectional view of an integrated circuit package of the present invention.

Referring to the drawings more particularly by reference numbers, FIG. 3 is an integrated circuit package 10 of the present invention. The package 10 includes a substrate 12 which has a first side 14 and a second side 16. An integrated circuit 18 is mounted to the first side 14 of the substrate 12. The integrated circuit 18 is connected to bond fingers 20 or other interconnect features located on the first side 14 of the substrate 12. The integrated circuit 18 is typically coupled to the bond fingers 20 by wire bonds 22. The integrated circuit 18 and bond fingers 20 may be enclosed by a plastic molded housing 24.

Located on the second side 16 of the substrate 12 are a plurality of contact pads 26. The contact pads 26 are coupled to the bond fingers 20 and the integrated circuit 18 by vias 28 that extend through the substrate 12. A solder ball 30 is attached to each contact pad 26.

Figure 4:
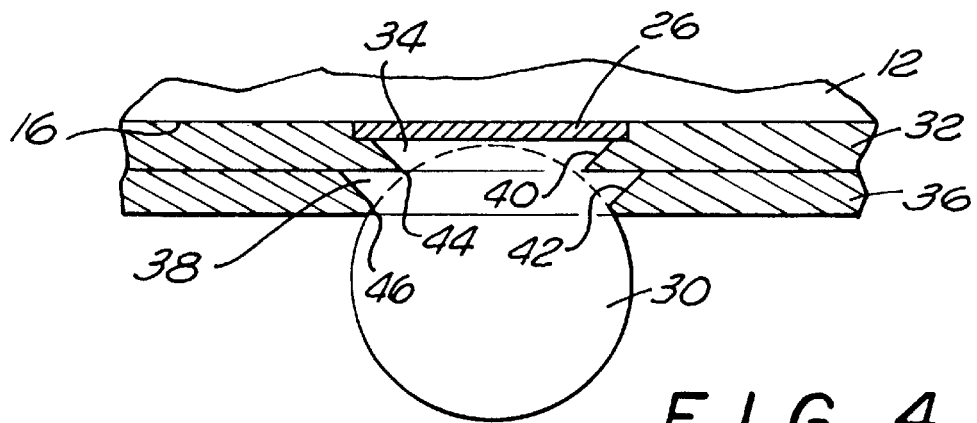
FIG. 4 is an enlarged sectional view showing a solder ball attached to a substrate of the integrated circuit package.

As shown in FIG. 4 a first layer of solder mask 32 is located on the second side 16 of the substrate 12. The first layer of solder mask 32 has a plurality of first openings 34 that each expose at least a portion of an adjacent contact pad 26. Each first opening 34 has a first diameter.

Adjacent to the first layer of solder mask 32 is a second layer of solder mask 36. The second layer of solder mask 36 has a plurality of second openings 38 that also expose the contact pads 26. Each second opening 38 has a diameter that is greater than the first diameter of each first opening 34.

The openings 34 and 38 are typically formed by an etching process that leaves a pair of inner lips 40 and 42 in the first 32 and second 36 layers of solder mask, respectively. Each lip 40 and 42 has a corresponding tip 44 and 46. The diameters of the first 34 and second 38 openings may be such that the tips 44 and 46 do not protrude into the solder ball 30. In one embodiment the diameter of the first opening 34 is approximately 0.03 inches and the diameter of the second opening 38 is approximately 0.036 inches for a solder ball 30 that has a diameter of approximately 0.040 inches.

Figure 5:
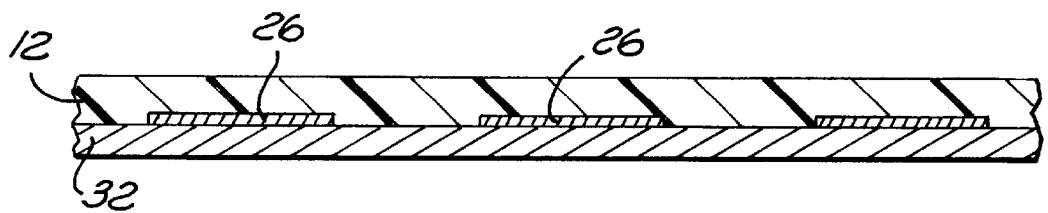
FIG. 5 is an enlarged sectional view showing a first layer of solder mask applied to a substrate of the integrated circuit package.
Figure 6:
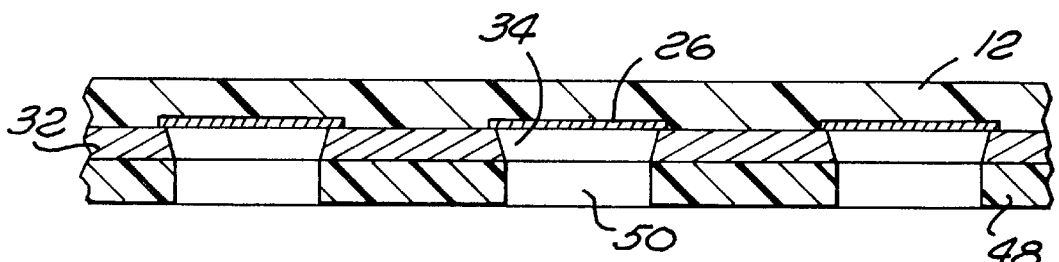
FIG. 6 is a view similar to FIG. 5 showing an opening formed in the solder mask.

FIGS. 5–8 show a method for assembling the solder mask to the substrate. As shown in FIG. 5, the first layer of solder mask 32 is applied to the entire second side 16 of the substrate 12. As shown in FIG. 6, an etch resist mask 48 is applied to the first layer 32. The etch resist mask 48 has openings 50 that allow an etchant to remove solder mask material and form the first openings 34.

Figure 7:
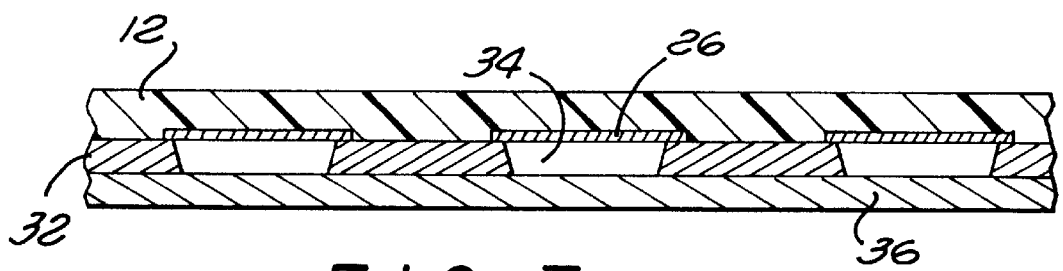
FIG. 7 is a view similar to FIG. 6 showing a second layer of solder mask applied to the first layer of solder mask.
Figure 8:
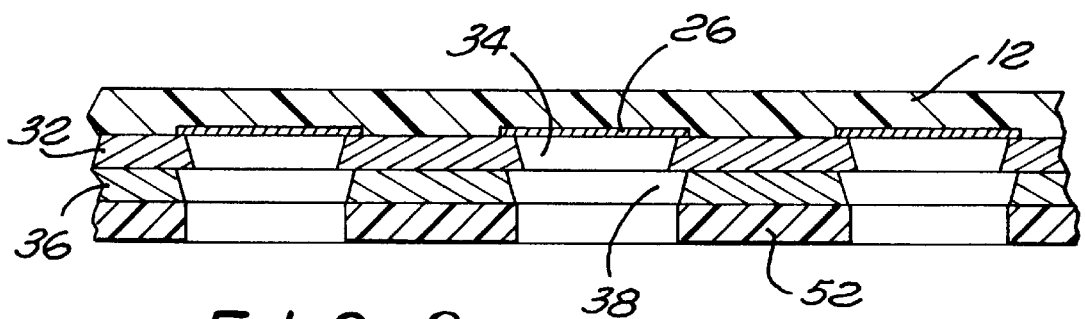
FIG. 8 is a view similar to FIG. 7 showing an opening formed in the second layer of solder mask.

The resist mask 48 is removed, and the first layer 32 is cured, typically with an ultraviolet light process. The second layer of solder mask 36 is then applied to the first layer of solder mask 32 as shown in FIG. 7. As shown in FIG. 8, a second etch resist mask 52 is applied so that an etchant can create the second openings 38 and remove resist material from the first openings 34. The second etch resist mask 52 is removed and the solder balls 30 are attached to the contact pads 26 to create the assembly depicted in FIG. 3. The solder balls 30 are typically attached to the contact pads 26 by placing pre-formed balls onto the pads 26 and then reflowing the solder.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus, comprising:
   a substrate which has a contact pad that has an external surface;
   a first layer of solder mask which has a first opening that exposes at least a portion of said external surface of said contact pad, said first opening having a first diameter; and,
   a second layer of solder mask which has a second opening that exposes at least a portion of said external surface of said contact pad, said second opening having a second diameter that is larger than said first diameter of said first opening.

2. The apparatus as recited in claim 1, wherein said first diameter is approximately 0.030 inches and said second diameter is approximately 0.036 inches.

3. An integrated circuit package, comprising:
   a substrate which has a contact pad;
   a first layer of solder mask which has a first opening that exposes at least a portion of said contact pad, said first opening having a first diameter;
   a second layer of solder mask which has a second opening that exposes at least a portion of said contact pad, said second opening having a second diameter that is larger than said first diameter of said first opening;
   an integrated circuit mounted to said substrate; and,
   a solder ball that is attached to said contact pad within said first and second openings.

4. The integrated circuit package as recited in claim 3, wherein said first diameter is approximately 0.030 inches and said second diameter is approximately 0.036 inches.

5. A method for creating solder mask openings in a substrate which has a contact pad that has an external surface, comprising:
   a) applying a first solder mask to the substrate;
   b) forming a first opening in the first solder mask to expose at least a portion of the external surface of the contact pad, wherein the first opening has a first diameter;
   c) applying a second solder mask to the first solder mask; and,
   d) forming a second opening in the second solder mask to expose at least a portion of the external surface of the contact pad, wherein the second opening has a second diameter that is greater than the first diameter.

6. The method as recited in claim 5, wherein said first and second openings are etched.

7. The method as recited in claim 5, further comprising the step of attaching a solder ball to the external surface of the contact pad.

* * * * *